(12) United States Patent
Long et al.

(10) Patent No.: US 12,720,705 B2
(45) Date of Patent: Aug. 25, 2026

(54) COOLING TANK FOR COMPUTING EQUIPMENT, COOLING DEVICE, AND COMPUTING APPARATUS INCLUDING THE SAME

(71) Applicant: STRAITDEER PTE. LTD., Singapore (SG)

(72) Inventors: Zhengxiang Long, Singapore (SG); Haiquan Liu, Singapore (SG); Qingyan Yang, Singapore (SG); Guihong Ren, Singapore (SG); Qingxiu Peng, Singapore (SG)

( * ) Notice: Subject to any disclaimer, the term of this patent is extended or adjusted under 35 U.S.C. 154(b) by 317 days.

(21) Appl. No.: 18/450,582

(22) Filed: Aug. 16, 2023

(65) Prior Publication Data

US 2024/0064934 A1 Feb. 22, 2024

(30) Foreign Application Priority Data

Aug. 18, 2022 (CN) ......................... 202222180921.3

(51) Int. Cl.
*H05K 7/20* (2006.01)

(52) U.S. Cl.
CPC ..... *H05K 7/20272* (2013.01); *H05K 7/20236* (2013.01); *H05K 7/20281* (2013.01)

(58) Field of Classification Search
CPC ........... H05K 7/20272; H05K 7/20236; H05K 7/20281
USPC .......................................................... 361/699
See application file for complete search history.

(56) References Cited

U.S. PATENT DOCUMENTS 9,504,190 B2 * 11/2016 Best ..................... H05K 7/2079
10,401,924 B2 * 9/2019 Saito ........................ B66D 3/26
10,645,841 B1 * 5/2020 Mao .................. H05K 7/20781
10,782,751 B1 * 9/2020 Gauthier ............. F24D 17/0042
11,375,638 B2 * 6/2022 Cheng ................ H05K 7/20818
11,714,467 B2 * 8/2023 Mao .................... H01M 10/613 361/699
11,744,043 B2 * 8/2023 Gao ................... H05K 7/20318 361/679.53
11,839,053 B2 * 12/2023 Wu .................... H05K 7/20318
11,889,658 B2 * 1/2024 Gao ................... H05K 7/20781
11,968,803 B2 * 4/2024 Gao ................... H05K 7/20327
12,075,599 B2 * 8/2024 Lin .................... H05K 7/20781
12,189,441 B2 * 1/2025 Ramakrishnan ...... H01L 23/481
12,295,118 B1 * 5/2025 Chigullapalli ......... H05K 7/203
2014/0218859 A1 * 8/2014 Shelnutt ............. H05K 7/20809 361/679.46

(Continued)

FOREIGN PATENT DOCUMENTS

CN 114885567 A * 8/2022 ......... H05K 7/20836

*Primary Examiner* — Anatoly Vortman
(74) *Attorney, Agent, or Firm* — Chang & Hale LLP

(57) ABSTRACT

A cooling tank for computing equipment, a cooling device, and a container type computing apparatus are provided. A cooling tank for computing equipment may include: a tank body for accommodating coolant and computing equipment immersed in the coolant; a liquid inlet pipe extending along a length direction of the tank body, with a rectangular cross-section and multiple holes arranged on opposite side walls along the length direction of the tank body; and a liquid outlet pipe, which extends along the length direction of the tank body, and is arranged at a higher position than the liquid inlet pipe.

10 Claims, 12 Drawing Sheets

(56) References Cited

U.S. PATENT DOCUMENTS

2014/0301037 A1* 10/2014 Best .................. H05K 7/20781 29/857
2014/0362527 A1* 12/2014 Best .................. H05K 7/20781 361/679.53
2015/0062806 A1* 3/2015 Shelnutt ............. H05K 7/20318 361/679.53
2015/0181762 A1* 6/2015 Boyd ................. H05K 7/20236 165/104.33
2015/0334880 A1* 11/2015 Best .................. H05K 7/20836 361/679.47
2017/0295676 A1* 10/2017 Conn ................. H05K 7/20772
2017/0354061 A1* 12/2017 Saito ......................... F25D 9/00
2018/0084671 A1* 3/2018 Matsumoto ........ H05K 7/20772
2018/0196484 A1* 7/2018 Saito ....................... H01L 23/44
2019/0383559 A1* 12/2019 Aoki .................. F28D 1/05316
2020/0029464 A1* 1/2020 Inano ................. H05K 7/20272
2020/0352058 A1* 11/2020 Zhong ................ H05K 7/20781
2020/0371569 A1* 11/2020 Mao .................. H05K 7/20236
2023/0084765 A1* 3/2023 Gao .................. H05K 7/20254 361/679.53

* cited by examiner

COOLING TANK FOR COMPUTING EQUIPMENT, COOLING DEVICE, AND COMPUTING APPARATUS INCLUDING THE SAME

CROSS-REFERENCE

The present disclosure claims a benefit of, and priority to Chinese patent application No. 202222180921.3 filed on Aug. 18, 2022, the disclosure of which is hereby expressly incorporated by reference herein in its entirety.

TECHNICAL FIELD OF THE DISCLOSURE

This disclosure relates to the field of computing, in particular to an immersed cooling tank, cooling device, and a container type computing apparatus with multiple such cooling tanks or cooling devices.

BACKGROUND

With the development of computer networks and communication technology, various applications are occurring rapidly, resulting in a sharp increase in demand for the capability of computing (referred to as "computing capability") in data centers. Compared to conventional computers, servers have better stability, scalability, and other performance, which brings higher computing density.

Correspondingly, the improvement of server performance results in a large amount of heat generated during operation. In order to ensure the normal operation of the server, the heat dissipation of various computing equipment in the server has become a technical problem that needs to be solved. The general solution is to install large fans or high-performance radiators such as heat pipes or water-cooled heat dissipation plates on each computing equipment, but these solutions all have their own drawbacks. For example, due to the high placement density of the computing equipment, it affects air circulation; besides, the low specific heat of the air leads to a low heat transfer efficiency. Therefore, fans may not meet the performance requirement of high density heat dissipation. The cost of heat pipes or water-cooled heat dissipation plates is relatively high, so equipping each computing device with heat pipes or water-cooled heat dissipation plates will greatly increase the cost of servers. One alternative solution is to use an air conditioning room, but the compressor of the air conditioning system may cause significant power consumption, which is not conducive to energy efficiency during long-term use.

SUMMARY

In response to the above issues, this application is proposed, which provides a cooling tank for computing equipment, a cooling device, and a container type computing apparatus to meet needs for high-density heat dissipation in scenarios such as data centers. It may be easily, quickly and conveniently deployed, provide excellent heat dissipation effects, and have low cost and energy efficiency.

According to an exemplary embodiment, a cooling tank for computing equipment is provided. The cooling tank comprises: a tank body for accommodating coolant and computing equipment immersed in the coolant; a liquid inlet pipe extending along a length direction of the tank body, with a rectangular cross-section and multiple holes arranged on opposite side walls along the length direction of the tank body; and a liquid outlet pipe extending along the length direction of the tank body, and arranged at a higher position than the liquid inlet pipe.

In some embodiments, a flow reducing plate is arranged in the liquid inlet pipe, and multiple holes are formed on the flow reducing plate.

In some embodiments, a flow guide having a trench shape is also provided on circumference of the liquid outlet pipe to accommodate the liquid outlet pipe, and the flow guide is installed on the tank body.

In some embodiments, multiple holes are formed on the liquid outlet pipe, and the multiple holes are formed in a lower pipe wall of the liquid outlet pipe.

In some embodiments, the cooling tank further comprises a cover capable of closing the tank body.

In some embodiments, a support block is arranged at a bottom of the tank body, and a height of the support block is flush with a height of the liquid inlet pipe.

According to an exemplary embodiment, a cooling device for computing equipment is provided. The cooling device comprises: a frame with a structure having at least an upper part and a lower part, and the frame comprising support brackets arranged at the upper part and lower part respectively; a cooling tank arranged on the support bracket at the upper part of the frame, for accommodating coolant and multiple computing equipment immersed in the coolant; and a heat exchanger, arranged on the support bracket at the lower part of the frame, for exchanging heat between the coolant in the cooling tank and another cooling medium flowing through the heat exchanger, a coolant outlet of the heat exchanger being connected to a lower part of the cooling tank through a liquid outlet pipe of the heat exchanger, and a coolant inlet of the heat exchanger being connected to an upper part of the cooling tank through a liquid inlet pipe of the heat exchanger.

In some embodiments, the cooling tank comprises a cooling tank liquid inlet pipe and a cooling tank liquid outlet pipe, the cooling tank liquid inlet pipe being connected to the liquid outlet pipe of the heat exchanger, the cooling tank liquid inlet pipe extending along a length direction of the cooling tank. The cooling tank liquid inlet pipe has a rectangular cross-section, and multiple holes are arranged along the length direction of the cooling tank on opposite side walls of the cooling tank liquid inlet pipe, and the cooling tank liquid outlet pipe is arranged at a higher position than the cooling tank liquid inlet pipe.

In some embodiments, a flow reducing plate is arranged in the liquid inlet pipe of the cooling tank, and multiple holes are formed on the flow reducing plate.

In some embodiments, a flow guide having a trench shape is arranged on circumference of the cooling tank liquid outlet pipe for accommodating the cooling tank liquid outlet pipe. The flow guide is installed on the tank body of the cooling tank.

In some embodiments, multiple holes are formed on the cooling tank liquid outlet pipe, and the multiple holes are formed in a lower pipe wall of the cooling tank liquid outlet pipe.

In some embodiments, a support block is arranged at a bottom of the cooling tank, and a height of the support block is flush with a height of the cooling tank liquid inlet pipe.

In some embodiments, the liquid inlet pipe of the heat exchanger is connected to an oil pump arranged on the support bracket at the lower part of the frame, for pumping coolant flowing out of the cooling tank into the heat exchanger.

In some embodiments, the other cooling medium is water, and a first end of the heat exchanger is provided with a water inlet and a water outlet. The cooling water flows into or out of the heat exchanger through a water pump arranged on the support bracket at the lower part of the frame.

In some embodiments, the coolant outlet of the heat exchanger is arranged at the first end of the heat exchanger, and the coolant inlet of the heat exchanger is arranged at a second end of the heat exchanger, the second end being opposite to the first end.

In some embodiments, the cooling device further comprises one or more of the following sensors: an outlet temperature sensor for monitoring coolant temperature at the coolant outlet of the heat exchanger, an inlet temperature sensor for monitoring coolant temperature at the coolant inlet of the heat exchanger, a coolant flow sensor for monitoring coolant flow, a coolant pressure sensor for monitoring coolant pressure, an ambient temperature sensor for monitoring temperature around the cooling tank, and a cooling tank level sensor for detecting a level of coolant in the cooling tank.

In some embodiments, the cooling equipment also comprises a control cabinet, which is arranged on the support bracket at the lower part of the frame for controlling operation of the cooling device based on sensing data monitored by one or more of the sensors.

According to an exemplary embodiment, a computing apparatus is provided. The computing apparatus comprises: a container body; a plurality of cooling devices for computing devices as described earlier, the plurality of cooling devices being arranged within the container body; and a power distribution cabinet, arranged on one side of the container body, for supplying power to at least the computing equipment and the cooling device.

In some embodiments, the plurality of cooling devices are arranged in multiple rows along a length direction of the container body.

In some embodiments, the computing apparatus further comprises a switch arranged within the container body for providing network connection for the computing equipment; and a power distribution unit connected to the power distribution cabinet through a cable, comprising multiple power sockets to distribute power to devices powered by the power distribution cabinet.

According to an exemplary embodiment, a computing apparatus is provided. The computing apparatus comprises: a container body portion and an open space portion arranged on a support base plate, a cooling tower arranged in the open space portion on the support base plate, the computing apparatus further comprises: a bracket within the container body portion for providing one or more support positions; and a plurality of cooling tanks as described above, arranged on the support position of the bracket, wherein a liquid inlet pipe and a liquid outlet pipe of each cooling tank are respectively connected to a coolant outlet and a coolant inlet of the cooling tower through pipes.

In some embodiments, the container body portion comprises a first container body portion and a second container body portion, and the open space portion is located between the first container body portion and the second container body portion, and one or more cooling towers are provided in the open space portion to provide cooling to the first container body portion and the second container body portion.

In some embodiments, the cooling tower comprises: a coolant path, comprising a fin pipe and a coil pipe connected in series, wherein the fin pipe is located above the coil pipe; a spray pipe, located between the fin pipe and the coil pipe, for spraying cooling water onto the coil pipe; a water sink located below the coil pipe for accommodating cooling water; a water pump used to pump the cooling water in the water tank into the spray pipe; and an exhaust fan located above the fin pipe.

By adopting a highly modular integrated design, the cooling tank, cooling device, and computing apparatus of this application have a simple structure, which is easy to install, maintain, and manage. The structure and size may be adjusted according to the actual situation, and thus they can be applied to various server devices, thereby facilitating the deployment of servers or data centers. At the same time, the cooling channel of the cooling tank is designed appropriately, so the cooling device has strong heat dissipation ability, which may be suitable for being deployed in various scenarios such as high temperature and high humidity.

The above and other features and advantages of this application will become apparent from the description of exemplary embodiments in conjunction with the accompanying drawings below.

DETAILED DESCRIPTION

Figure 1:
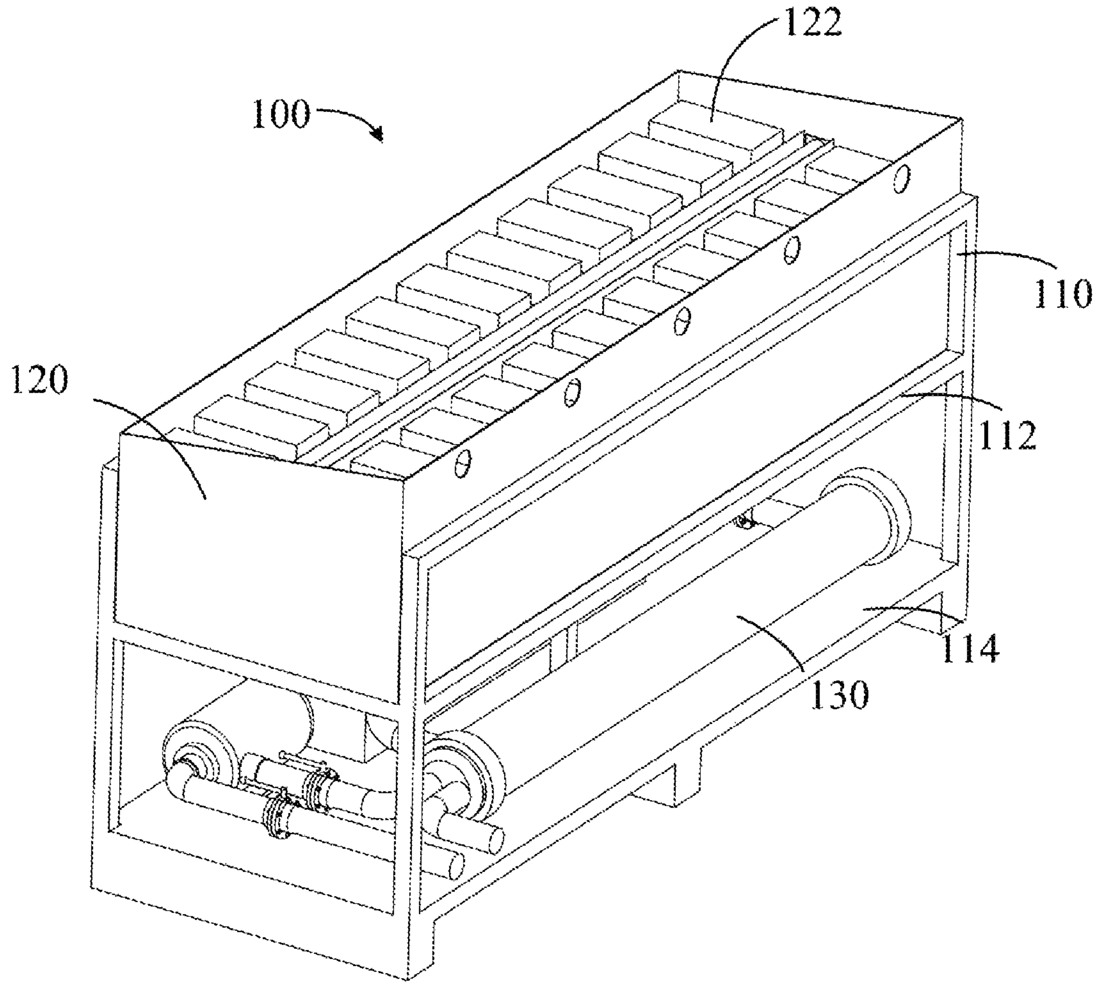
FIG. 1 shows an external schematic diagram of a cooling device for a computing equipment according to an embodiment of the present disclosure.

The following describes exemplary embodiments of the present application with reference to the accompanying drawings. In the drawings, the same reference numerals usually represent the same or functionally similar components. It should be understood that the dimensions and sizes of the components shown in the drawings are not necessarily drawn to scale, and they may differ from the embodiments shown here for implementation. In addition, some embodiments may incorporate any appropriate combination of features from two or more accompanying drawings.

FIG. 1 shows an external schematic diagram of a cooling device 100 for a computing equipment according to an embodiment of the present disclosure. As shown in FIG. 1, the cooling device 100 for computing equipment comprises a frame 110, which substantially is a cuboid frame, and its length, width and height may be adjusted according to the computing equipment or heat exchanger that needs to be supported. The frame 100 has a structure with at least two parts, namely the upper part and the lower part, and comprises a support bracket 112 arranged at the upper part and a support bracket 114 arranged at the lower part. Although the support bracket is shown in FIG. 1 to be a plate-like structure, this disclosure is not limited to this, and it may also be a frame structure or other structures, as long as it could provide sufficient support for computing equipment, heat exchange equipment, etc. The support bracket 112 and support bracket 114 may have the same structure or be configured as different structures.

A cooling tank 120 and a heat exchanger 130 for heat exchange of the coolant are respectively arranged at the upper and lower parts of the frame 110. Specifically, the cooling tank 120 is arranged on the support bracket 112 at the upper part of the frame, which may be used to contain coolant and multiple computing equipment 122 immersed in the coolant. The multiple computing equipment may, for example, support parallel computing and may be used for high-density computing in servers. The heat exchanger 130 is installed on the support bracket 114 at the lower part of the frame, and can be used for exchanging heat between the coolant in the cooling tank 120 and another cooling medium flowing through the heat exchanger 130, thereby cooling the heated coolant in the cooling tank and reintroducing it into the cooling tank for heat dissipation and cooling of the computing equipment. For example, the coolant outlet of heat exchanger 130 may be connected to the lower part of cooling tank 120 through the heat exchanger liquid outlet pipe, to introduce the coolant into the cooling tank 120 after heat exchange in the heat exchanger 130, and the coolant inlet of heat exchanger 130 is connected to the upper part of cooling tank 120 through the heat exchanger liquid inlet pipe, to guide the coolant into the heat exchanger 130 after heat exchange with computing equipment in the cooling tank.

The cooling tank 120 may be detachably fixed to the frame 110. In order to enhance stability, it may also be welded onto the frame 110. The cooling tank 120 may have a long strip shape extending along the frame 110, with side walls and a bottom wall to facilitate the placement of computing equipment 122 into the cooling tank 120. The upper surface of the cooling tank 120 may be open, or a cover (not shown) may be set that may close the cooling tank 120 to reduce the evaporation of the coolant. The cover is pivotally connected to a side wall and thus may be opened and closed. The cooling tank 120 may accommodate multiple computing equipment 122, which are immersed in the coolant. The coolant exchanges heat with the immersed part of the computing equipment, and may be an insulating and thermal conductive liquid, such as vegetable oil, mineral oil, organic liquid materials, etc. The coolant is preferred to have a low viscosity, a low volatility, and a high specific heat to facilitate flow and carry away the heat generated by the computing equipment 122. For example, the coolant has a dynamic viscosity of less than 9.9 $mm^2/s$ measured according to ASTM D445 standard at 40° C. Low volatility ensures minimal loss of coolant, eliminating the need for frequent coolant replenishment.

The cooling tank 120 may have a long strip shape. The coolant inlet and outlet may be set at one end of the cooling tank 120 near the liquid inlet pipe or liquid outlet pipe of the heat exchanger 130. In another embodiment, the coolant inlet and outlet may also be set at the opposite ends of the cooling tank 120, which may promote the flow of the coolant to carry away heat and prevent the coolant from being stationary or forming vortices in local areas. The coolant inlet may be arranged in a lower area of the cooling tank 120 (such as near the bottom), while the coolant outlet may be arranged in the upper area of the cooling tank 120. Through the upward movement of the coolant due to heating and external pump forces, the circulation flow of the coolant is achieved, thereby quickly dissipating heat from the computing equipment immersed in the coolant, and ensuring the stable and reliable operation of the server.

The heat exchanger 130 may be fixed and installed on the support bracket 114 at the lower part of frame 110 through screws or other fixing methods, and placed on one side of the bottom bracket along the length direction of frame 110. The heat exchanger 130 may preferably be a tubular heat exchanger, which has lower water quality requirements than plate heat exchangers and does not require an accompanying soft water system. In one example, the shell material of the heat exchanger 130 may be selected as carbon steel, and the internal tubes may be made of red copper to promote heat exchange. In addition, the heat exchanger may also be equipped with multiple metal fins (not shown) to promote heat dissipation.

Figure 2:
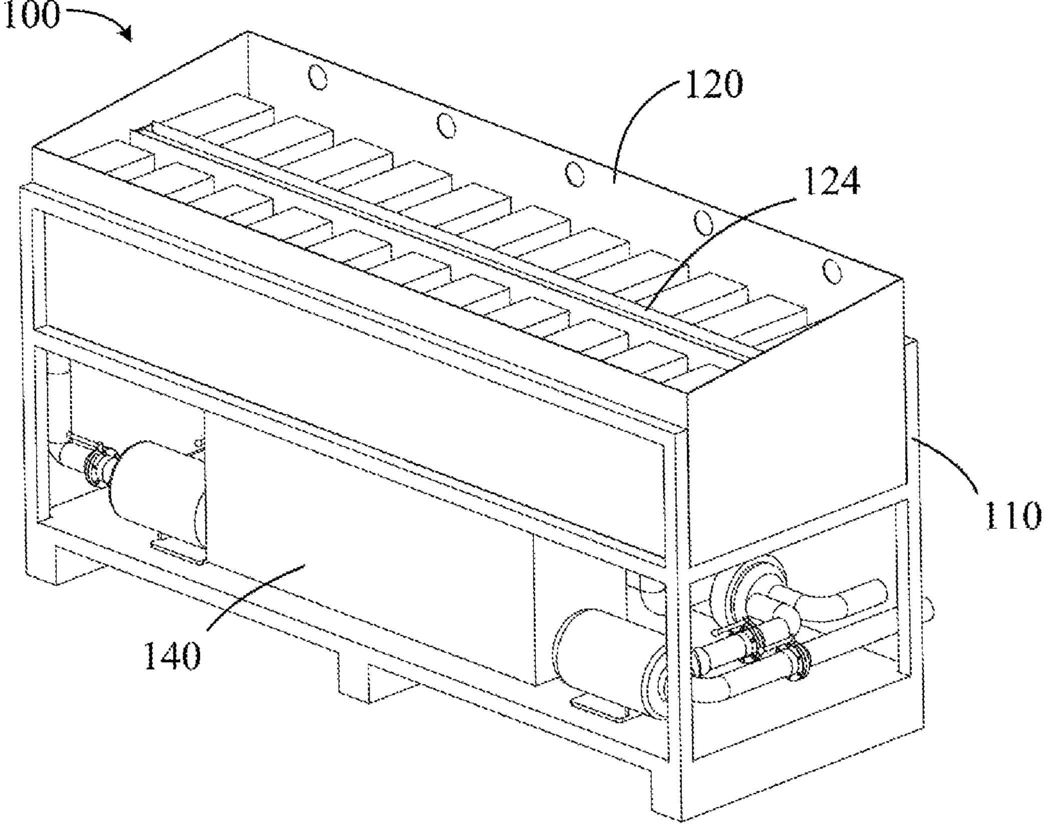
FIG. 2 shows an external schematic diagram of a cooling device for a computing equipment according to an embodiment of the present disclosure.

FIG. 2 shows an external schematic diagram of the cooling device at another angle for computing equipment according to an embodiment of the present disclosure. As shown in FIG. 2, a coolant outlet pipe 124 is arranged in the cooling tank 120, which may be connected to the liquid inlet pipe of the heat exchanger 130, so that the coolant is circulated into the heat exchanger 130 after exchanging heat with the computing equipment 122 in the cooling tank 120 and thus its temperature increases. In some examples, in addition to the liquid outlet pipe 124, a liquid inlet pipe may also be installed in the cooling tank 120. The specific structures of the liquid inlet pipe and liquid outlet pipe of the cooling tank will be described in detail below. In addition, a control cabinet 140 may also be installed on the support bracket 114, which may be for example placed on a side opposite to the heat exchanger 130, to improve the overall stability of the cooling device. Its specific functions will also be described below.

Figure 3:
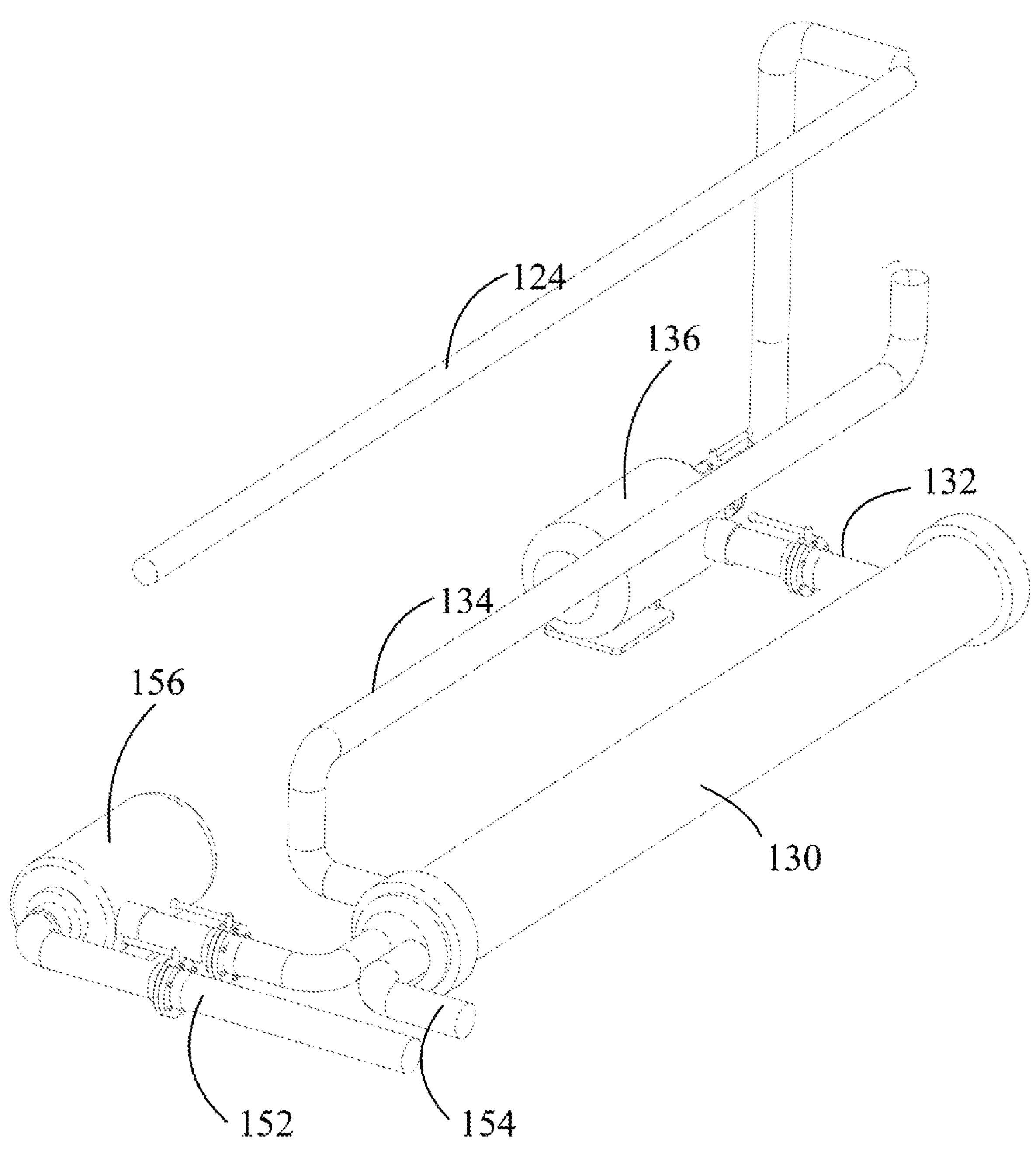
FIG. 3 shows a pipeline schematic diagram of a cooling device for a computing equipment according to an embodiment of the present disclosure.

FIG. 3 shows a pipeline schematic diagram of a cooling device for computing equipment according to an embodiment of the present disclosure. On one side of the heat exchanger 130, there is arranged a coolant inlet pipe 132, which is at least connected to an oil pump 136 for pumping coolant flowing out of the coolant outlet of the cooling tank 120 into the heat exchanger 130. The oil pump 136 may also be installed on the support bracket 114 at the lower part of the frame through fixing manners such as screws. The oil pump 136 may be controlled by the control cabinet 140, for example, by regulating the rotation rate of the oil pump 136 to adjust the output speed of the coolant in the cooling tank, thereby ensuring heat exchange efficiency and adapting to the cooling of server computing equipment under various loads. The liquid inlet pipe 132 may extend upwards and be connected to the liquid outlet pipe 124 arranged in the cooling tank 120. For example, the liquid inlet pipe 132 of the heat exchanger may be connected to the cooling tank liquid outlet pipe 124 through a right angle connecting pipe or the like. On the other end of the heat exchanger 130, a coolant outlet pipe 134 is installed to introduce the coolant after exchanging heat with cooling media in the heat exchanger 130 such as water into the cooling tank 120 for cooling the computing equipment. One end of the liquid outlet pipe 134 of the heat exchanger connected to the cooling tank is set lower than the liquid outlet pipe 124 of the cooling tank, to facilitate the circulation flow of the coolant which can be guided out from the cooling tank 120.

As shown in FIG. 3, at one end where the liquid outlet pipe 134 is connected with the heat exchanger 130, the heat exchanger 130 is further provided with a water inlet and a water outlet (i.e., another cooling medium used for exchanging heat with the coolant may be water). The water inlet and outlet may be connected to the water inlet pipe 152 and water outlet pipe 154 respectively through internal threads (such as DN 40). Cooling water may flow into or out of heat exchanger 130 through a water pump 156 arranged on the water inlet or water outlet pipe (e.g., the liquid outlet pipe shown in the figure), thereby exchanging heat with the coolant used for cooling the computing equipment inside heat exchanger 130. Similar to the oil pump 136, the water pump 156 may also be fixed to the support bracket 114 on the lower part of the frame through screws or other means. The water pump 156 may also be controlled through the control cabinet 140, for example, by regulating the rotation rate of the water pump 156 to adjust the delivery speed of cooling water in the heat exchanger 130, thereby ensuring heat exchange efficiency and adapting to the cooling of server computing equipment under various loads. In one example, the oil pump 136 and the water pump 156 may be controlled simultaneously to ensure that the temperature of the coolant after heat exchange is below a predetermined value (such as 40° C.). In one example, the hot water after heat exchange may be recycled and provided for other purposes, such as fish farming, greenhouse planting, and underfloor heating supply, thereby achieving the reuse of heat sources.

Figure 4:
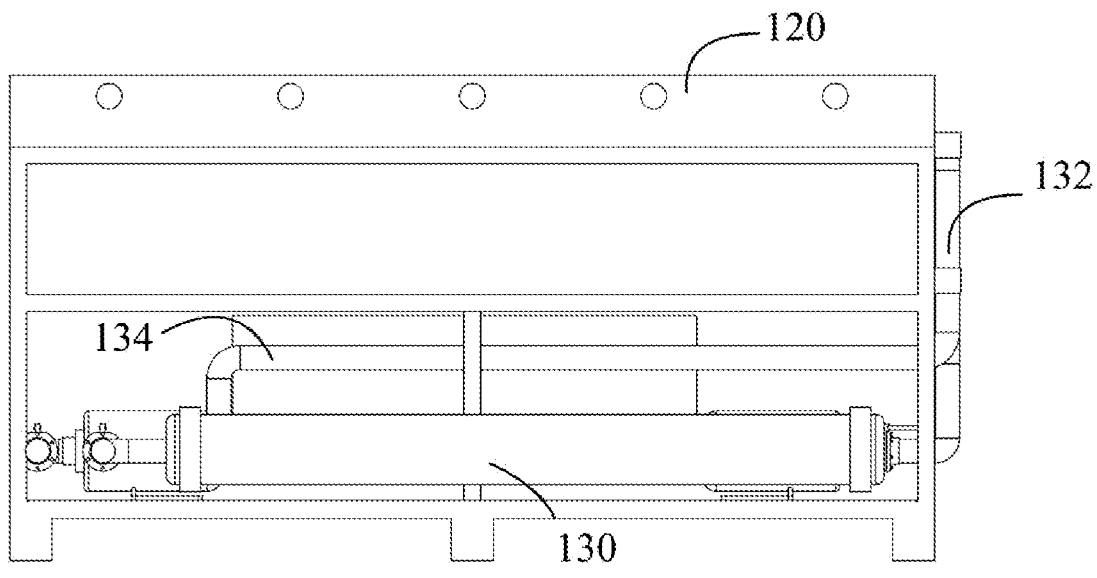
FIG. 4 shows a front view of a cooling device for a computing equipment according to an embodiment of the present disclosure.
Figure 5:
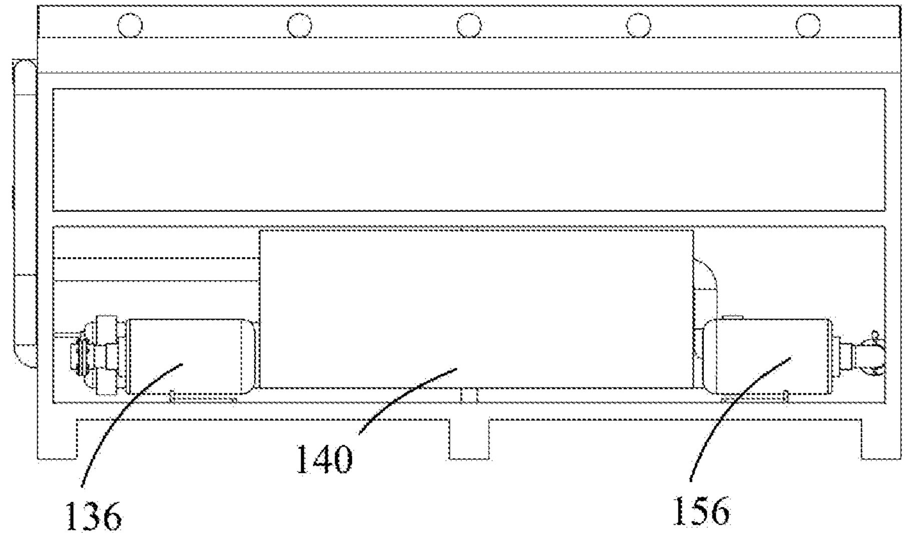
FIG. 5 shows a rear view of a cooling device for a computing equipment according to an embodiment of the present disclosure.

FIGS. 4-5 respectively show the front and rear views of the cooling device for the computing equipment according to an embodiment of the present disclosure. As shown in FIG. 4, the liquid inlet pipe 132 of heat exchanger 130 extends to the upper part of the right end side of cooling tank 120, and the liquid outlet pipe 134 of heat exchanger 130 also extends to the right end side of cooling tank 120, but is connected to cooling tank 120 at a slightly lower position. The circulating flow and heat exchange of cooling oil may take away the heat of computing equipment or servers, thereby ensuring the stable and reliable operation of the equipment. In addition, referring to FIG. 5, through the above structural arrangement, the oil pump 136 and water pump 156 are respectively installed on both sides of the control cabinet 140, ensuring stable vibration of the cooling device 100 during operation and improving the stable performance of the system.

In order to achieve continuous and stable operation of computing device 122, it is very important to ensure reliable and effective heat dissipation capacity. Therefore, it is necessary to ensure that the coolant may be evenly supplied to various computing equipment in the cooling tank 120 and continuously flow fully in cooling tank 120. If the coolant does not flow, computing equipment 122 may malfunction due to overheating and even cause irreparable damages to the hardware. In order to ensure sufficient circulation and flow of the coolant, in one embodiment of the present disclosure, the cooling tank liquid outlet pipe 124 may extend into the cooling tank 120, as shown in FIG. 6.

Figure 6:
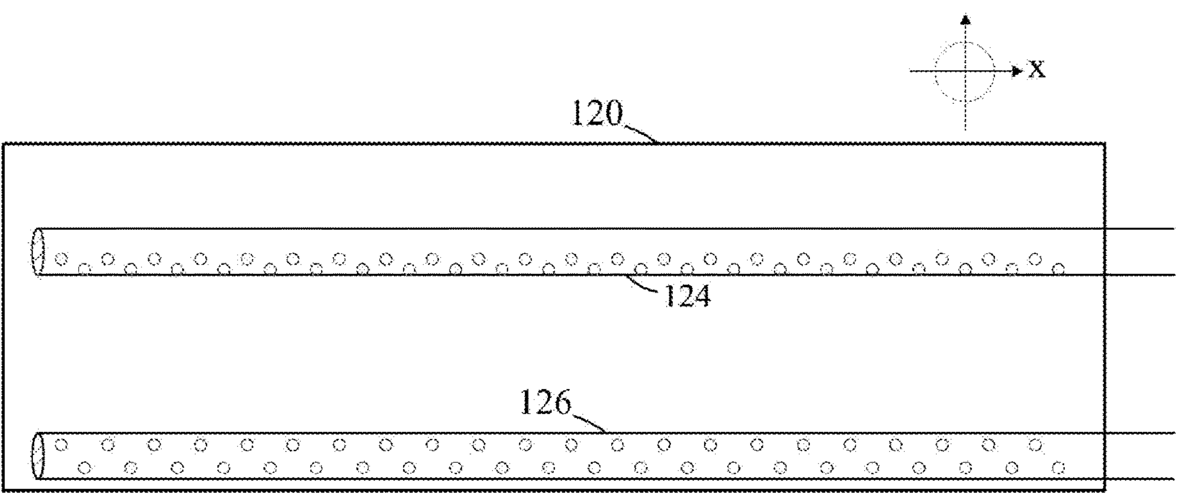
FIG. 6 shows a schematic diagram of a distribution pipe portion extending into a cooling tank according to an embodiment of the present disclosure.

FIG. 6 shows a schematic diagram of a liquid inlet and liquid outlet pipe portion extending into a cooling tank according to an embodiment of the present disclosure. Referring to FIG. 6, a liquid inlet pipe 126 is arranged at the lower part of the cooling tank 120 (below the liquid outlet pipe 124), which may be connected to the liquid outlet pipe 134 of the heat exchanger. The liquid outlet pipe 124 and liquid inlet pipe 126 in the cooling tank 120 may extend along the length direction of the cooling tank 120 and have multiple holes formed on them. Specifically, the cooling tank 120 has a long strip shape, and the liquid outlet pipe 124 and liquid inlet pipe 126 of the cooling tank may extend into the cooling tank 120 and extend along the length direction of the cooling tank 120. In some embodiments, the liquid outlet pipe 124 and liquid inlet pipe 126 may extend at least 80%, preferably more than 95% of the length of the cooling tank 120. For example, the liquid outlet pipe 124 extends to the other end of the cooling tank 120, thereby providing stable support for the liquid outlet pipe 124. One end of the liquid outlet pipe 124 and the liquid inlet pipe 126 may be closed, and there are many small holes on the part that extends into the cooling tank 120 for coolant to flow into or out of the cooling tank 120.

As shown in FIG. 6, the low-temperature coolant from heat exchanger 130 may uniformly flow into the cooling tank 120 along the porous portion of the cooling tank liquid inlet pipe 126. After the low-temperature coolant absorbs the heat from the computing equipment 122, the temperature thereof increases and it flows upwards inside the cooling tank 120. The liquid outlet pipe 124 located above may export the heat absorbed coolant, which is then pumped to the coolant inlet of the heat exchanger 130 through the oil pump 136 on the liquid inlet pipe 132 of the heat exchanger. Similarly, using a porous pipe design, the liquid outlet pipe 240 may evenly draw coolant along the length direction of the cooling tank 120, thereby achieving full flow of coolant 203 in the cooling tank 120. In an example, in order to prevent the inhalation of air or impurities or foreign objects floating on the liquid surface, the holes may be formed in the lower wall portion of the cross-section of the cooling tank liquid outlet pipe 124. For example, the holes may be formed in the wall portion of the pipe within the range of 0 to 45 degrees and 135 to 360 degrees (as may be understood by referring to the coordinate system of the pipe cross-section in the figures), which means that no holes are formed in the upper wall portion within the range of 45 to 135 degrees.

Referring to FIGS. 1-6 above, an exemplary structure of the cooling device of the present disclosure is described, which adopts a highly modular integrated design, and it is easy to install and maintain, so it could be applied to various common server devices. The structural dimensions of the frame or cooling tank may be adjusted according to the actual situation to facilitate the deployment of servers or data centers. At the same time, the exemplary cooling device does not need to be paired with systems such as cooling towers to achieve energy-saving and efficient heat dissipation, and may be suitable for deployment needs in various scenarios such as high temperature and high humidity.

It should be noted that FIGS. 1-6 only illustrate the exemplary structural arrangement of the present disclosure, and those skilled in the art may adjust the size and position of some components according to the actual situation, which is still within the scope of the present disclosure. In addition, the structure of cooling tank 120 may be improved and designed to promote the circulation and flow of coolant, thereby improving the heat dissipation effect. In some embodiments, cooling tank 120 may also be used in conjunction with a cooling tower, and these solutions will be explained further below.

Figure 7:
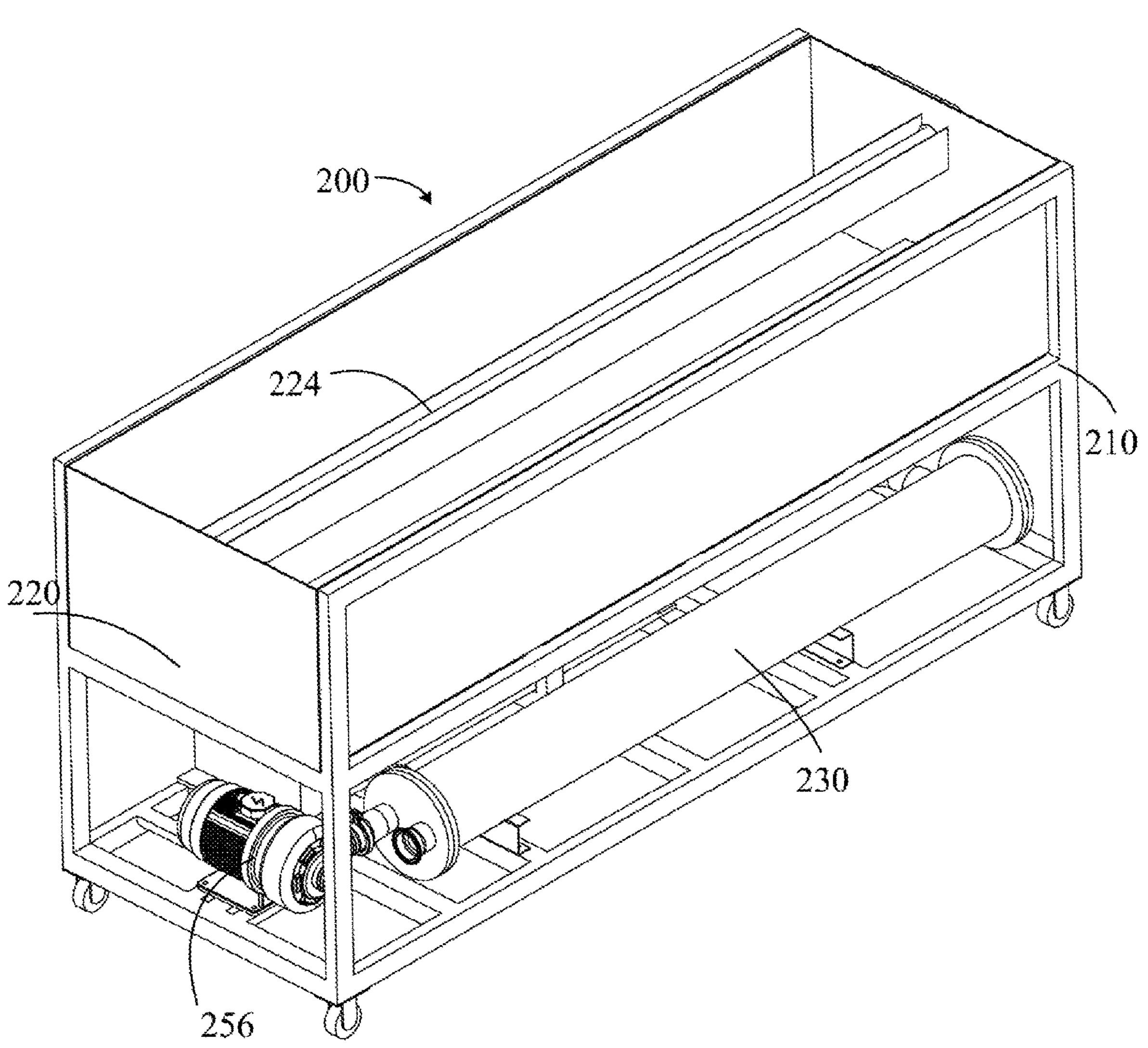
FIG. 7 shows an external schematic diagram of a cooling device for a computing equipment according to another embodiment of the present disclosure.

FIG. 7 shows an external schematic diagram of a cooling device 200 for computing equipment according to another embodiment of the present disclosure. Similar to the cooling device 100 shown in FIG. 1, the cooling device 200 shown in FIG. 7 also comprises a frame 210, a cooling tank 220, and a heat exchanger 230. The frame 210 has a structure with at least two parts, however, different from the frame 110, the lower support bracket of the frame 210 is a frame structure rather than a plate structure.

A cooling tank 220 and a heat exchanger 230 for exchanging heat with the coolant are respectively arranged in the upper and lower parts of the frame 210. A cooling tank 220 is arranged on a support bracket on the upper part of the frame body, for accommodating coolant and multiple computing equipment immersed in the coolant. The heat exchanger 230 is installed on a support bracket at the lower part of the frame, used to exchange heat between the coolant in the cooling tank 220 and another cooling medium (such as water) flowing through the heat exchanger 230, so that the heated coolant in the cooling tank may be cooled and reintroduced into the cooling tank for heat dissipation and cooling the computing equipment. As shown in FIG. 7, at one end of the heat exchanger 230, there is also a water inlet and a water outlet, which may be connected to the water inlet and water outlet pipes (not shown) through threaded connections. Cooling water may flow into or out of the heat exchanger 230 through water pump 256 installed on the water inlet or water outlet pipe, thereby exchanging heat with the coolant flowing out of liquid outlet pipe 224 of cooling tank 220, inside the heat exchanger 230.

Figure 8:
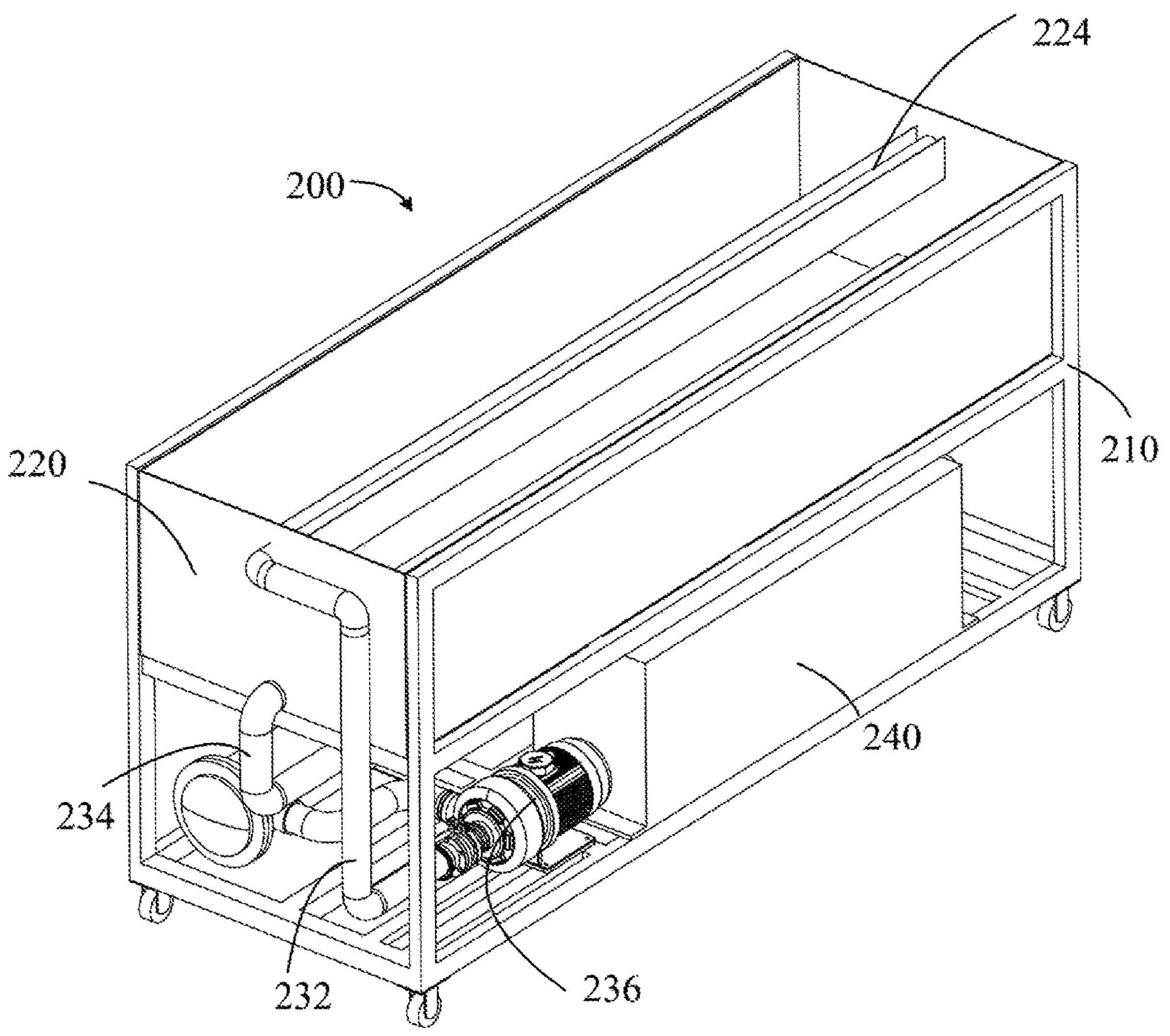
FIG. 8 shows an external schematic diagram of a cooling device for a computing equipment according to another embodiment of the present disclosure.

FIG. 8 shows an external schematic diagram of a cooling device for computing equipment at another angle according to another embodiment of the present disclosure. As shown in FIG. 8, a coolant inlet pipe 232 is arranged on one side of heat exchanger 230, onto which at least an oil pump 236 is connected to pump the upper coolant in cooling tank 220 flowing out of cooling tank outlet pipe 224 into the heat exchanger 230. At the same time, on the other side of the heat exchanger 230, there is also a coolant outlet pipeline 234 (only a portion thereof is shown), which may be used to reintroduce the coolant after heat exchange in heat exchanger 230 into cooling tank 220. A control cabinet 240 may also be installed on the lower support bracket, which may be placed on the opposite side of the heat exchanger 230, for example, to improve the overall stability of the device. The control cabinet 240 may be used to control the oil pump 236, water pump 256, or the like, on both sides, for example, by regulating the rotation rates of the oil pump 236, water pump 256 to adjust the flow speed of the coolant and water in the heat exchanger 230, thereby ensuring heat exchange efficiency and adapting to the cooling of server computing equipment under various loads. In one example, the control of oil pump 236 and water pump 256 may ensure that the temperature of the coolant after heat exchange in heat exchanger 230 is below a predetermined value (such as 40° C.).

Figure 9:
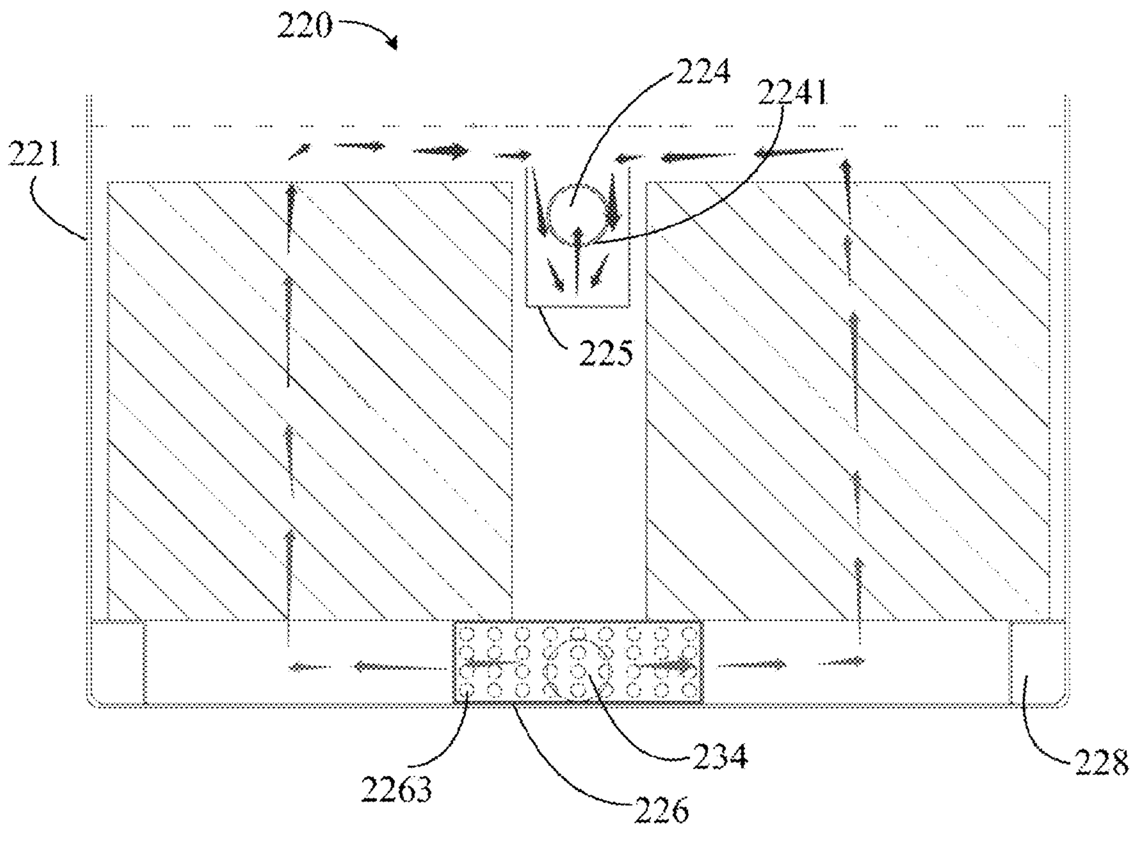
FIG. 9 shows a cross-sectional schematic diagram of a cooling tank for a computing equipment according to an embodiment of the present disclosure.

FIG. 9 shows a cross-sectional schematic diagram of a cooling tank for computing equipment according to an embodiment of the present disclosure. The cooling tank 220 may be applied to the cooling device 200 shown in FIGS. 7-8, or alternatively applied to the cooling device 100 shown in FIGS. 1-5. As shown in FIG. 9, the cooling tank 220 may comprise a tank body 221, which may be used to accommodate coolant and computing equipment immersed in the coolant. In one example, a cover (not shown) that may close the cooling tank is provided on the tank body 221 to reduce the evaporation of the coolant. In order to circulate the coolant, a liquid inlet pipe 226 and a liquid outlet pipe 224 may be installed in the cooling tank 220. The liquid inlet pipe 226 is arranged at the lower part of the tank body 221, such as in the middle of the bottom to facilitate the placement of computing equipment on both sides. In one example, a support block 228 is provided at the bottom of the tank, and the height of the support block is flush with the height of the liquid inlet pipe 226, so that the computing equipment may be placed on the liquid inlet pipe 226 and the support block 228.

The liquid inlet pipe 226 may extend along the length direction of the tank body 221, for example, from one end of the tank body 221 to the opposite end. As shown in the figure, the cross-sectional area of the liquid inlet pipe 226 is rectangular and there are multiple holes on the opposite side walls along the length direction of the tank body. In one example, the liquid inlet pipe 226 of the cooling tank may be connected to the liquid outlet pipe 234 of the heat exchanger at its end in a sealing manner, allowing coolant to flow from the liquid outlet pipe 234 of the heat exchanger into the liquid inlet pipe 226 of the cooling tank, and then into the cooling tank 220 through the opening on its side wall. The liquid outlet pipe 224 is arranged at the upper part of the tank body 221, that is, it is arranged at a higher position than the liquid inlet pipe 226, for example, directly above the liquid inlet pipe 226. The liquid outlet pipe 224 extends along the length direction of the tank body, and its cross-sectional area may be circular.

Figure 10:
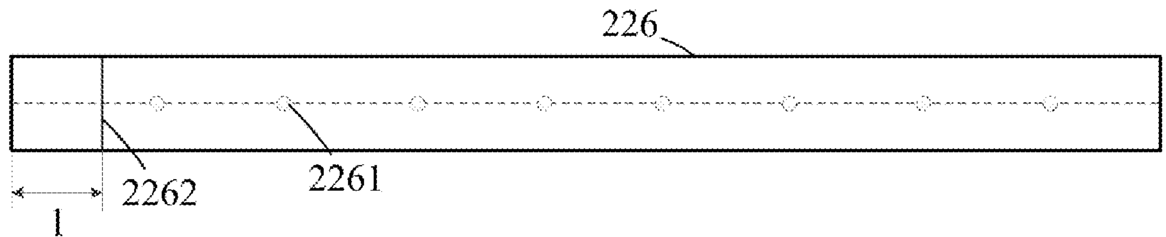
FIG. 10 shows a side view of the liquid inlet pipe of a cooling tank for a computing equipment according to an embodiment of the present disclosure.

FIG. 10 shows a side view of the liquid inlet pipe of a cooling tank for computing equipment according to an embodiment of the present disclosure. As shown in the figure, the liquid inlet pipe 226 is a long square pipe, with multiple openings 2261 symmetrically arranged on the pipe walls of both sides. The shape of the holes may be circular, slot shaped, etc. In an example, a flow reducing plate 2262 may be installed at a certain distance 1 (for example, 40-100 mm) from the coolant inlet end of the liquid inlet pipe 226, and multiple holes may be formed on the plate.

Referring back to FIG. 9, the flow reducing plate 2262 is arranged with multiple rows of circular holes 2263, the radius of which may be ⅕-⅙ of the height of the flow reducing plate. They may effectively buffer and reduce the flow of coolant flowing out from the heat exchanger 230, thereby preventing the formation of rapid or eddy currents when the coolant enters the cooling tank.

In one example, a flow guide 225 that accommodates the liquid outlet pipe 224 may also be provided on the circumference of the liquid outlet pipe 224 of the cooling tank. The flow guide 225 may have a trench shape and be installed on the tank body 221 through welding, clamping, or other methods. As shown in FIG. 9, the cross section of the flow guide 225 is U-shaped, and its opening is positioned higher than the top of the liquid outlet pipe 224, so that the coolant near the liquid level which is flowing upward due to being heated first flows into the flow guide 225, and then flows into the liquid outlet pipe 224 through the opening on the liquid outlet pipe 224, to prevent the liquid outlet pipe from absorbing only the coolant directly below it, which causes the coolant on both sides of the outlet pipe not to participate fully in the circulation. At the same time, the eddy currents that occur near the liquid outlet pipe 224 will be limited in the flow guide to prevent adverse effects on the components in the computing equipment. In one example, multiple holes may be formed on the liquid outlet pipe 224, and they may be formed in the lower wall 2241 of the cross-sectional area of the liquid outlet pipe 224, that is, the multiple openings are facing downwards. The openings may have a strip or circular shape. The coolant is sucked into the liquid outlet pipe through the multiple openings, and then flows out of the cooling tank.

Figure 11:
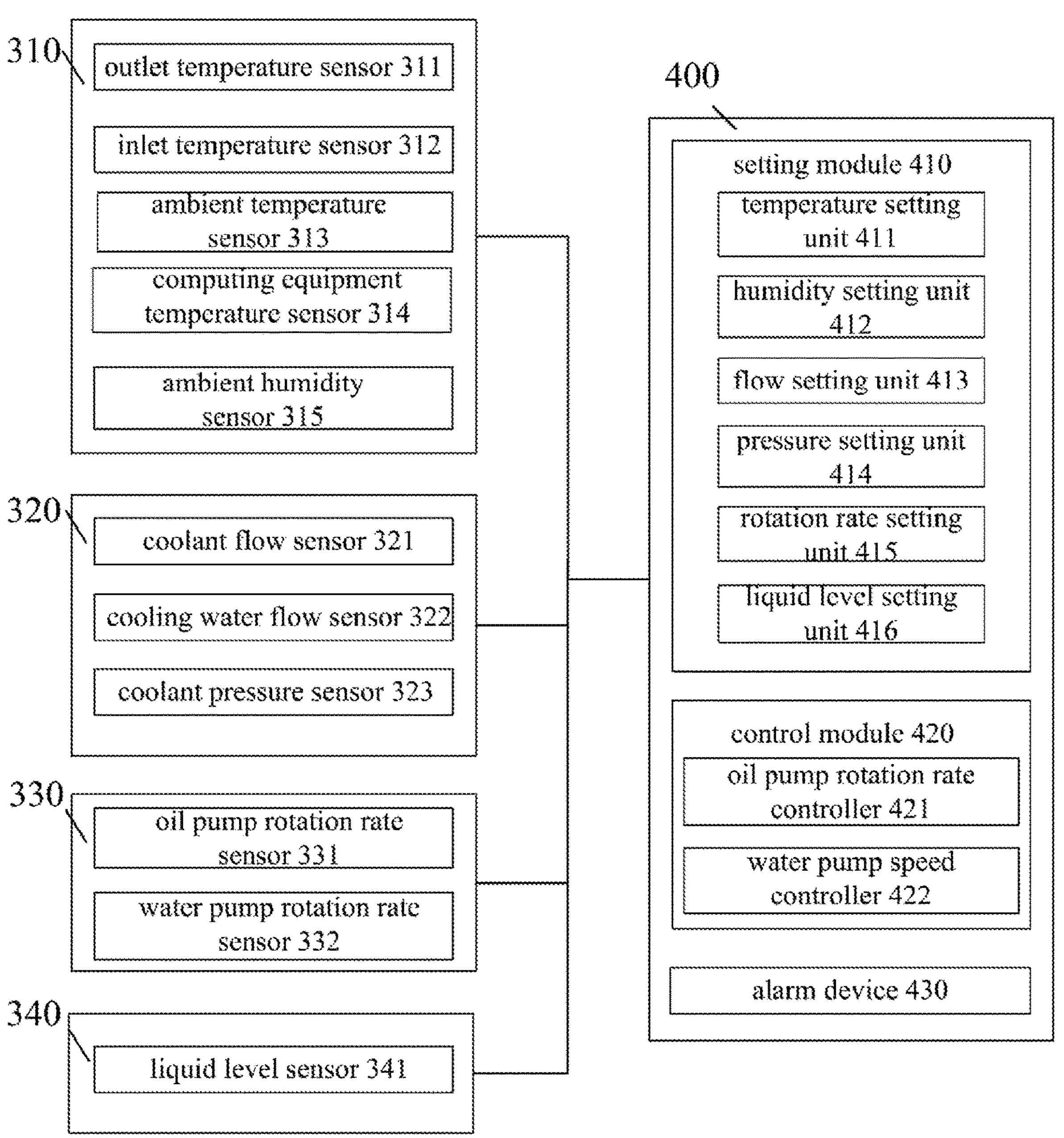
FIG. 11 shows a schematic block diagram of a control system of a cooling device according to an embodiment of the present disclosure.

The following describes the control method of control cabinet 240. In addition to controlling the rotation rates of oil pump and water pump, the control cabinet may also monitor and control other operating parameters such as temperature and humidity. FIG. 11 shows a schematic block diagram of the control system of the cooling device 200 according to an embodiment. As shown in FIG. 11, the control system of the cooling device may comprise a temperature and humidity sensing system 310, a flow and pressure sensing system 320, a rotation rate sensing system 330, a liquid level sensing system 340, and a control device 400.

The temperature and humidity sensing system 310 may comprise one or more temperature sensors and humidity sensors, for example, multiple coolant temperature sensors, such as outlet temperature sensor 311 set at the coolant outlet of heat exchanger 230 and coolant inlet temperature sensor 312 set at the coolant inlet of heat exchanger 230, which are respectively used to monitor the coolant temperature at the coolant outlet and coolant inlet of the heat exchanger 230. If the coolant temperature at the outlet is too high (such as above 40° C.) or the coolant temperature at the coolant inlet is too high (such as above 60° C.), it indicates that heat exchanger 230 has not achieved a good heat exchange effect. At this time, the cooling capacity of the heat exchanger 230 may be improved by increasing the rotation rates of the oil pump 236 and water pump 256.

The temperature and humidity sensing system 310 may also comprise an ambient temperature sensor 313 that monitors the ambient temperature around the cooling tank. The sensor may use an infrared sensor, for example, to ensure that the ambient temperature around the cooling tank 220 is lower than the flash point temperature of the cooling oil. If the infrared sensor detects an area above the flash point temperature, it may indicate that a hazardous heat source has entered the deployment site of the server (such as a factory building or containers described later), and an alarm should be given to remind workers or maintenance personnel to eliminate risks. In an example, the computing equipment may comprise a temperature sensor 314 for monitoring the temperature of its chip or motherboard, which may directly determine the cooling state of the computing equipment based on the temperature indicated by it, thereby adjusting the circulation speed of the coolant and cooling water.

In an embodiment, the temperature and humidity sensing system 310 may also comprise an ambient humidity sensor 315 located around the cooling tank 220. If the ambient humidity is high (such as above 90% RH), dehumidification equipment (not shown) may be activated to reduce the ambient humidity, or an alarm signal may be issued to alert workers.

The flow pressure sensing system 320 may comprise a coolant flow sensor 321 for monitoring coolant flow and a cooling water flow sensor 322 for monitoring cooling water flow. In some embodiments, the coolant flow sensor 321 may be installed at the liquid inlet and/or outlet of each cooling tank 220, or alternatively or additionally on the liquid inlet or liquid outlet pipeline of the heat exchanger 230. A cooling water flow sensor 322 may be installed on the liquid inlet or liquid outlet pipeline of cooling water. Flow sensors 321 and 322 may monitor the circulation status of coolant and cooling water, and may issue alarm signals to alert workers in case of abnormalities. The flow pressure sensing system 320 may also comprise a coolant pressure sensor 323, which may be installed on the liquid inlet pipe 232 or liquid outlet pipe 234 of the heat exchanger, for monitoring coolant pressure. The pressure sensor 323 may monitor the pressure of the coolant and issue an alarm signal to alert workers in case of abnormalities.

The rotation rate sensing system 330 may comprise an oil pump rotation rate sensor 331 for monitoring the rotation rate of oil pump 236, and a water pump rotation rate sensor 332 for monitoring the rotation rate of water pump 256. The rotation rate value sensed by these sensors reflects the operating status of the cooling system. When any rotation rate value is abnormal, an alarm signal may be issued to remind the working personnel. For example, when it is detected that oil pump 236 is not working and causes the coolant temperature to rise, an alarm may be issued to alert the working personnel.

The liquid level sensing system 340 may comprise a cooling tank liquid level sensor 341 installed in the cooling tank 220 for monitoring the liquid level of the coolant. When the liquid level is too high or too low, that is, above the upper limit or below the lower limit of the liquid level, an alarm signal may be issued to remind the working personnel to check the coolant. For example, when the coolant is insufficient or the pipeline is blocked, timely inspection is necessary to eliminate the fault and ensure the normal operation of the cooling system.

The control device 400 may comprise a setting module 410, a control module 420, and an alarm module 430, which may be provided, for example, in the control cabinet 240. The setting module 410 may be used to set the reference range of the sensing values of the above sensors, that is, the normal operating range of the relevant parameters. For example, the setting module 410 may comprise a temperature setting unit 411, a humidity setting unit 412, a flow setting unit 413, a pressure setting unit 414, a rotation rate setting unit 415, and a liquid level setting unit 416, which are used to set the normal operating reference range or alarm threshold of each of the temperature sensors (311-314), humidity sensor (315), flow sensors (321-322), pressure sensor (323), rotation rate sensors (331-332), and liquid level sensor 341 mentioned above, respectively.

The control module 420 may control the operation of the cooling device 200 based on the monitored sensing data of one or more of the aforementioned sensors. Specifically, it may control the operating status of one or more components of the cooling device 200 based on the sensing values of the sensing systems 310-340 or the comparison results between the sensing values and the set reference parameter range. For example, the control module 420 may comprise an oil pump rotation rate controller 421 for regulating the rotation rate of oil pump 236 to control the coolant circulation speed, and a water pump speed controller 422 for regulating the rotation rate of water pump 256 to control the cooling water circulation speed. The control module 420 may control the cooling capacity of cooling device 200 by adjusting the operating status of these components, thereby achieving a balance between cooling capacity and economy. For example, when the coolant temperature is within the normal temperature range, various components may be controlled to operate at a low speed, thereby saving power consumption.

It may be understood that the above setting module 410 and the control module 420 may be implemented as a programmable logic controller (PLC) and installed in the control cabinet 240 described above. It may automatically perform the adjustment and control of related parameters based on a plurality of sensing data according to a preset program, so that it may quickly respond to various parameter changes to perform adjustment and control, and thus save manpower.

The alarm device 430 may comprise, for example, one or more indicator lights or buzzers, which may emit alarm signals in the form of sound or light. For example, when the detected value of one or more sensors exceeds the corresponding set reference range, the alarm device 430 may issue an alarm signal to remind workers.

It may be understood that the multiple temperature, humidity, flow, pressure and other sensors and corresponding control methods set up for the cooling device 200 may also be applied to the cooling device 100, and will not be repeated here.

Figure 12:
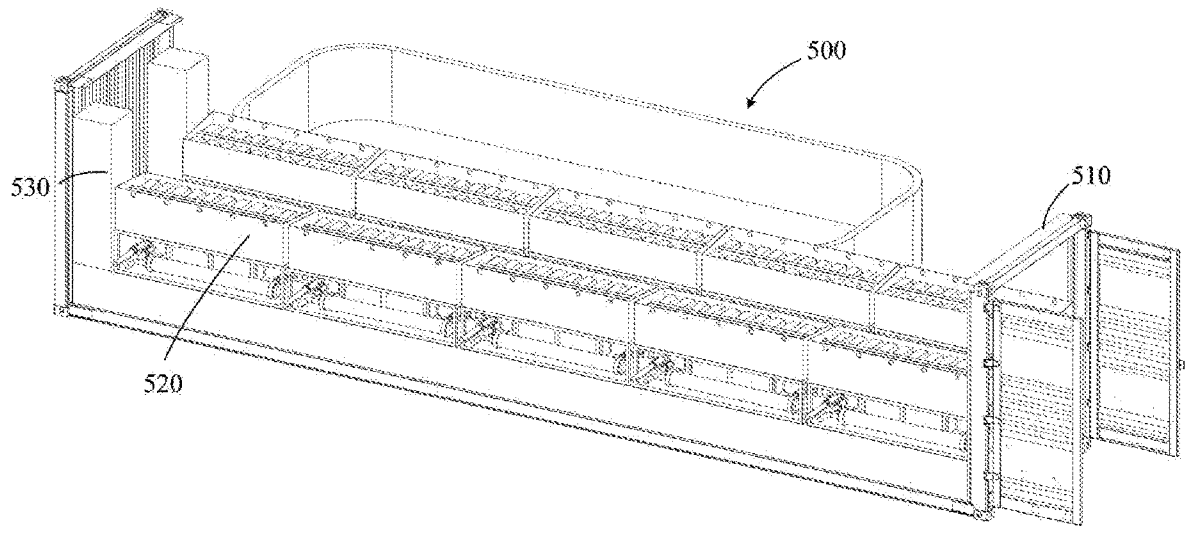
FIG. 12 shows an external schematic diagram of a container type computing apparatus according to an embodiment of the present disclosure.

FIG. 12 shows an external schematic diagram of a container type computing apparatus according to an embodiment of the present disclosure. It schematically illustrates a container type data center that integrates multiple computing equipment (i.e. "computers") into the container, thereby providing high-density and powerful computing processing capabilities. As shown in the figure, the container type computing apparatus 500 comprises a container body 510, and the container body portion 510 surrounds the container cabin. The computing equipment may be installed in the container cabin. Specifically, the container type computing apparatus 500 may comprise multiple cooling devices 520 inside for computing equipment, located inside the container 510 to accommodate multiple computing equipment. The structure of the cooling device 520 may be either the cooling device 100 or the cooling device 200 described earlier, and its specific structure will not be further described here.

In one example, multiple cooling devices 520 are arranged in multiple rows along the length direction of the container. Preferably, the figure shows the arrangement of cooling device 520 in two rows, allowing for space on both sides and in the middle of the container to accommodate other electrical or network equipment or for equipment maintenance operations. In order to ensure the normal operation of the computing equipment and cooling structure, the container type computing apparatus 500 may also comprise a power distribution cabinet 530, which is located at one side of the container 510 to provide power to at least the cooling device and computing equipment. The power distribution cabinet 530 may be configured with corresponding circuit modules, switches, and other components according to different electrical standards (UL, CE, CSA).

The container body portion 510 may comprise commonly used container boxes or modified boxes, such as iron or steel boxes, which provide sufficient support to facilitate container stacking and transportation. The container body portion 510 may be rectangular in shape and have commonly used container sizes, such as 20 foot standard container or high container, 40 foot standard container or high container, or any other size that may be determined according to actual needs. Although FIG. 12 only shows the doors, rear walls, and bottom base plates of the container box 510, it may be understood that it also comprises the left and right side walls and top plates to form a cabin space for enclosing the cooling device 520.

A switch and other necessary network devices (not shown) may also be installed inside the container to provide network connections for various computing equipment. The switch may be connected to the network ports of the computing equipment through twisted pair or fiber optic cables, thereby providing network connections for the computing equipment. Depending on the number of computing equipment and the number of network ports on each switch, the required number of switches may be determined. In one example, the switch may be powered through the power distribution cabinet 530.

In addition to network devices, the container may also be equipped with power distribution units (PDUs) and other power accessories. In one example, multiple power distribution units may be fixedly installed on the frames (such as support brackets) of each cooling device 520 and connected to the power distribution cabinet 530 through cables. Each power distribution unit may comprise multiple power sockets to distribute power to devices powered by the power distribution cabinet 530, that is, to power multiple computing equipment, oil pump, water pump, and other devices. For example, the cable plug of the powered device may be inserted into the socket on the power distribution unit.

In addition to being used in conjunction with a heat exchanger, the cooling tank 200 of the present disclosure may also be used in conjunction with cooling device such as a cooling tower to cool the computing equipment. The following will provide a specific description of this solution.

Figure 13:
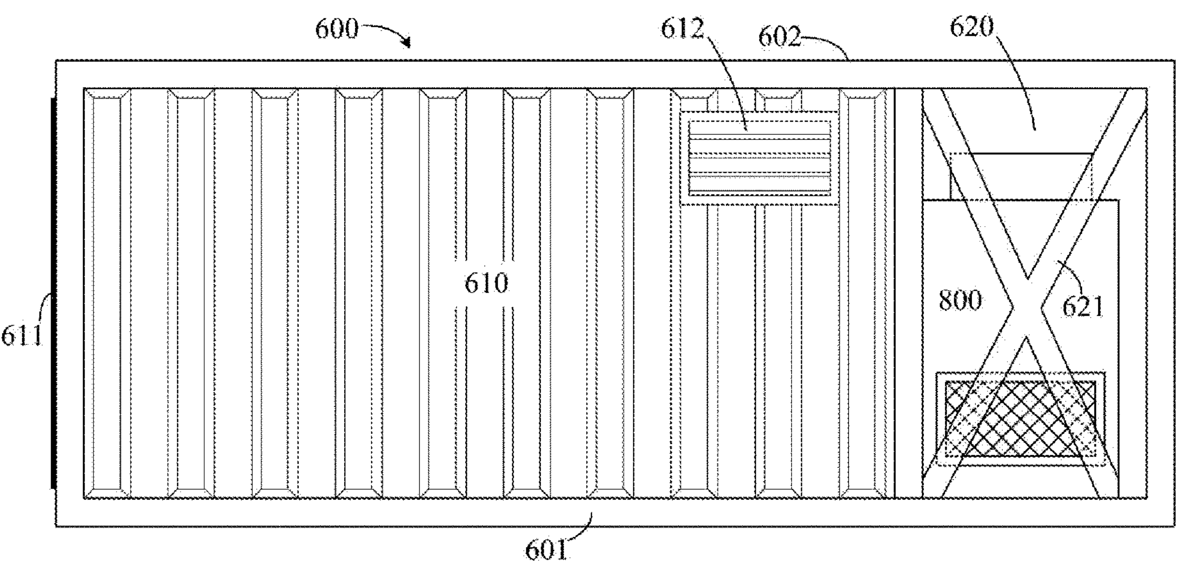
FIG. 13 shows an external schematic diagram of a container type computing apparatus according to another embodiment of the present disclosure.

FIG. 13 shows an external schematic diagram of a container type computing apparatus 600 according to another embodiment of the present disclosure. As shown in FIG. 13, the container type computing apparatus 600 comprises a container body portion 610 and an open space portion 620 arranged on a supporting base plate 601. The container body portion 610 surrounds the container cabin, and the computing equipment may be installed in the container cabin. The open space portion 620 is located at one end of the container body portion 610, and the cooling tower 800 may be installed in the open space portion 620.

The container body portion 610 may comprise commonly used container boxes, such as iron or steel boxes, which provide sufficient support to facilitate container stacking and transportation. The container body portion 610 may be rectangular in shape, and the total size of it and the open space section 620 may be commonly used container sizes, such as 20 foot standard container or high container, 40 foot standard container or high container, or any other size, which may be determined according to actual needs.

One end of the container body portion 610 opposite to the open space portion 620 may be equipped with a hatch 611. Although not shown, the lower part of hatch 611 may be equipped with ventilation windows, such as louvers. Alternatively or additionally, ventilation windows may also be installed on other parts of the container body portion 610, such as the sidewall near the hatch 611. On the side wall of the container opposite the hatch 611, an exhaust window 612 may be installed. Although FIG. 13 only shows one exhaust window 612, exhaust window(s) may be symmetrically arranged on the opposite sidewall that is not shown. An exhaust fan may be installed inside the exhaust window 612. By setting the ventilation windows and exhaust windows at both ends of the container body portion 610 along the length direction, it is convenient for air to flow throughout the entire cabin. Further, it is convenient to discharge hot air outside the container cabin by setting the exhaust window 612 on the upper side of the container.

The cooling tower 800 is located in the open space 620 outside the container body portion 610, which will be described in detail below.

As shown in FIG. 13, both the container body portion 610 and the open space portion 620 are arranged on the supporting base plate 601 of the container, and an integrated rectangular frame 602 may be arranged around the container body portion 610 and the open space section 620. The rectangular frame 602 defines the shape outline (i.e. container shape) and dimensions (such as commonly used container dimensions, which may also be other dimensions) of the container type computing apparatus 600. By setting up an integrated frame 602, the container body portion 610 and the open space portion 620 form an integral structure, which is also convenient for transportation of the entire structure. For example, the entire computing apparatus 600 may be handled, stacked, and transported like a regular container. In order to protect the cooling tower 800 located in the open space section 620 from accidental damage, a protective frame 621 may also be installed around the cooling tower 800, as shown in FIG. 13. The protective frame 621 may be connected to the rectangular frame 602 of the container. It may be understood that the protective frame 621 is not limited to the shape shown in FIG. 13, but may also have any other shape.

Figure 14:
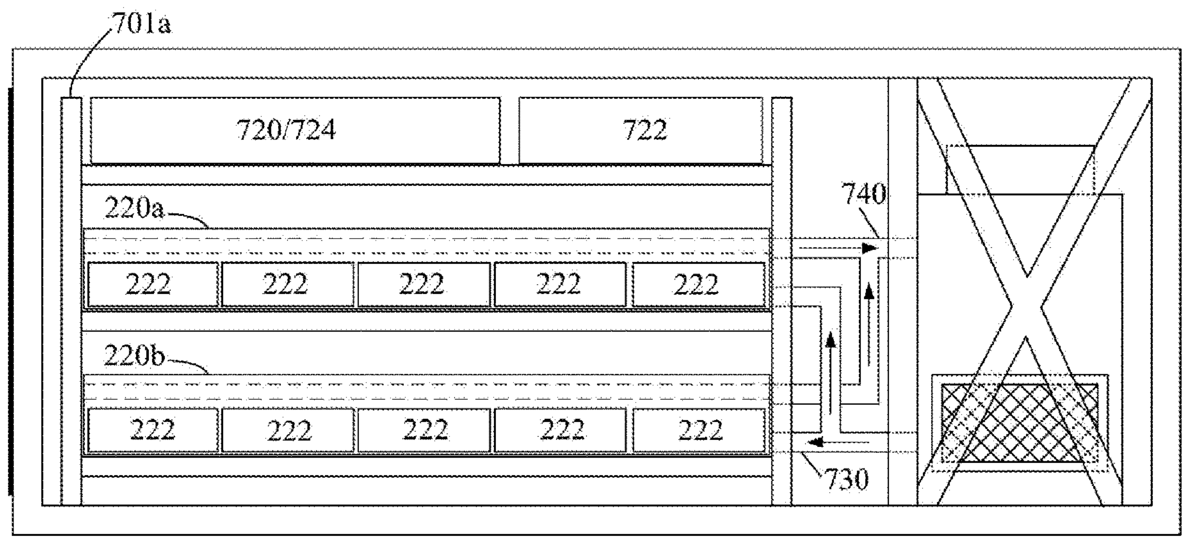
FIG. 14 shows a schematic side cross-sectional view of the container body portion of a container type computing apparatus according to another embodiment of the present disclosure.
Figure 15:
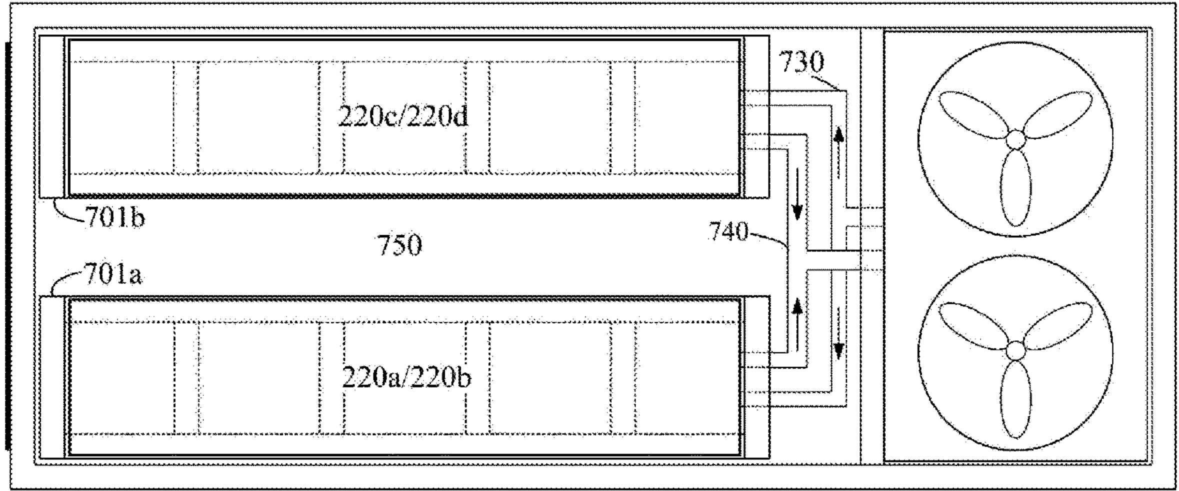
FIG. 15 shows a schematic top cross-sectional view of the container body portion of a container type computing apparatus according to another embodiment of the present disclosure.

FIG. 14 shows a schematic side cross-sectional view of the container body portion of the container type computing apparatus according to another embodiment of the present disclosure, and FIG. 15 shows a schematic top cross-sectional view of the container body portion of the container type computing apparatus according to another embodiment of the present disclosure. The following will describe the internal structural settings of the container body portion 610 in conjunction with FIGS. 14 and 15.

Referring to FIGS. 14 and 15, the container body portion 610 surrounds the internal cabin space, and a bracket 701 may be provided in the container cabin. The bracket 701 may have a single or multiple supporting planes, providing single or three-dimensional multi-plane support positions to fully utilize the three-dimensional cabin space. FIG. 14 shows that the bracket 701 has three planes of support positions, but depending on the size of the equipment supported on it, the bracket 701 may provide more or fewer planes of support positions. The support 701 may be installed on opposite sides of the cabin, e.g., supports **701*a* and 701*b* as shown in FIG. 15. The space between the two may be used as a maintenance channel 750**, facilitating equipment installation and maintenance by users.

Each bracket 701 may support multiple cooling tanks 220, for example, cooling tanks **220*a* and 220*b* may be supported on bracket 701*a*, and cooling tanks 220*c* and 220*d* may be supported on bracket 701*b*, where cooling tanks 220*a* and 220*c* are located on the same plane support position, and cooling tanks 220*b* and 220*d* are located on the same plane support position. Although FIG. 14 shows two planes of cooling tanks, bracket 701 may also be designed to support fewer planes, such as one, or more planes, such as three or four planes of cooling tanks. Each cooling tank 220 may be welded onto the bracket 701 or detachably fixed to bracket 701. The cooling tank 220 may have a structure as described with reference to FIGS. 7-9, except that it has a long strip shape extending along the bracket 701, which has a longer length compared to the cooling tank shown in FIGS. 7-9 and may accommodate a larger number of computing equipment. Correspondingly, the liquid outlet pipe and liquid inlet pipe of the cooling tank are also set to have longer lengths. Other aspects of cooling tank 220** may refer to the previous description, and will not be further elaborated here.

The cooling tank 220 may have a long strip shape, and the inlet and outlet for the coolant may be set at one end of the cooling tank 220 near the cooling tower 800, or in another embodiment, the inlet and outlet for the coolant may also be set at opposite two ends of the cooling tank 220, which may promote the flow of the coolant to carry away heat and prevent the coolant from being stationary or forming vortices in local areas. As shown in FIGS. 14 and 15, the liquid inlet pipe and liquid outlet pipe of cooling tank 220 may be connected to the coolant outlet and coolant inlet of the cooling tower 800 through pipelines 730 and 740, respectively. Specifically, the liquid inlet pipe of cooling tank 220 may be connected to the coolant outlet of cooling tower 800 through the pipeline 730 while the liquid outlet pipe of cooling tank 220 may be connected to the coolant inlet of cooling tower 800 through the pipeline 740 (also known as liquid returning pipe).

The bracket 701 may also be arranged with a distribution box 720, a switch 722, a control cabinet 724, and other computing auxiliary devices. The specific technical structure and functions of these devices may be referred to the inventor's Chinese patent application CN202221495304.6, the entire content of which is hereby incorporated into present disclosure by reference.

When the length of the container type computing apparatus 600 increases, as described earlier, the length of the container body portion 610 and the cooling tank 220 inside will also increase. Although a larger cooling tower 800 may be set to provide sufficient cooling capacity, uneven cooling may occur along the length direction of the cooling tank 220. For example, the coolant in the cooling tank 220 at the end near the cooling tower 800 is prone to participating in circulation and being cooled, while the coolant in the cooling tank 220 at the end far away from the cooling tower 800 is not prone to participating in circulation and being cooled. For example, the structure shown in FIG. 13 may be used for a container of 20 feet, but when the container size increases to 40 feet, there may be uneven cooling in cooling tank 220.

For this purpose, in one embodiment, a first container body portion and a second container body portion may be provided on the support base plate 601, each container body portion surrounding a separate cabin, and an open space portion 620 may be arranged between the first container body portion and the second container body portion. In this way, the structure of each container body portion may be the same as described earlier with reference to FIGS. 13 to 15, and will not be repeated here. A larger cooling tower 800 may be installed in the open space section 620 to provide cooling for the first and second container body portions, or two cooling towers may be installed to provide cooling for the first and second container body portions respectively, or more cooling towers may be installed to provide cooling for each plane of, each column of, or each cooling tank 220, respectively.

Figure 16:
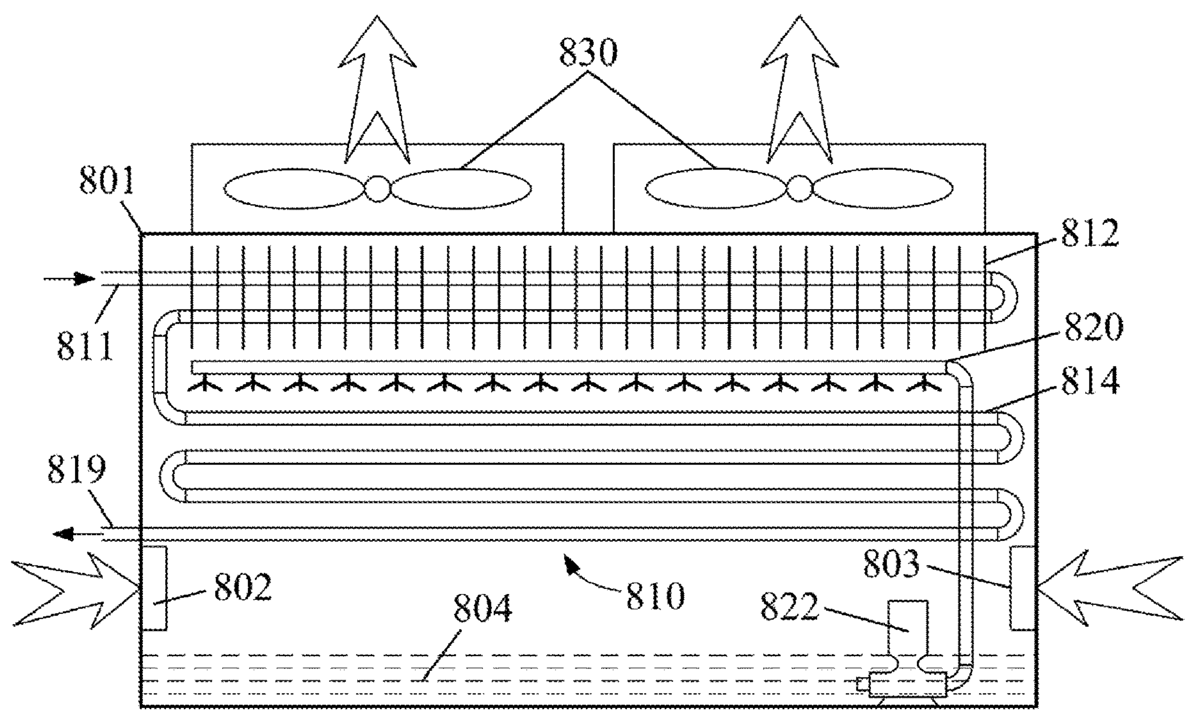
FIG. 16 shows a schematic cross-sectional view of a cooling tower of a container type computing apparatus according to an embodiment of the present disclosure.

FIG. 16 shows a schematic cross-sectional view of a cooling tower 800 according to an embodiment. The cooling tower 800 may employ both air and liquid cooling methods to cool the coolant. As shown in FIG. 16, the cooling tower 800 may comprise a coolant path 810 located inside the shell 801, which may comprise a fin pipe 812 and a coil pipe 814 located between the liquid inlet 811 and outlet 819. The outlet 819 is located below the liquid inlet 811. The fin pipe 812 and the coil pipe 814 are connected in series, and the coil pipe 814 may be located below the fin pipe 812. The coolant path 810 may be made of a thermally conductive metal such as copper to promote heat exchange. The fin pipe 812 and the coil pipe 814 both comprise metal pipes that wind back and forth to increase the heat dissipation area. The fin pipe 812 may also comprise multiple metal fins welded onto the metal pipes to further increase the heat dissipation area.

The cooling tower 800 also comprises a spray pipe 820, which may be arranged above the coil pipe 814, for example, between the coil pipe 814 and the fin pipe 812. The spray pipe 820 may have many small holes or a nozzle installed thereon to facilitate the spraying of cooling water to the coil pipe 814 for heat dissipation. The sprayed cooling water is collected by the water tank 804 below the coil pipe 814 after passing through the coil pipe 814. A water pump 822 may pump the cooling water from the water tank 804 into the spray pipe 820, achieving the circulation and utilization of the cooling water.

The top of the cooling tower 800 may be equipped with an exhaust fan 830. Depending on the floor area of the cooling tower 800, one or more exhaust fans 830 may be installed. Although FIG. 16 shows two exhaust fans 830, for example, one exhaust fan 830 or four exhaust fans 830 may also be installed. The lower part of the shell 801 may be equipped with one or more ventilation windows, such as ventilation windows 802 and 803. When the exhaust fan 830 is running, air is drawn from ventilation windows 802 and 803 into the interior of the cooling tower, flowing from bottom to top to cool the components inside, and then discharged from the top of the cooling tower into the external environment.

The cooling tower 800 adopts a combination of liquid cooling and air cooling, which may effectively cool the coolant from the cooling tank 220. Moreover, since the cooling tower 800 avoids the use of compressors, it reduces power consumption and reduces the operating cost of the entire system.

Although some embodiments of the present disclosure have been described, these embodiments are presented as examples only and are not intended to limit the scope of the present invention. In fact, the novel methods and systems described in this disclosure may be implemented in various other forms. In addition, various omissions, substitutions, and changes may be made in the form of the methods and systems described in this disclosure without departing from the scope of this disclosure.

What is claimed is:

1. A cooling device for computing equipment, comprising:

a frame with a structure having at least an upper part and a lower part, the frame comprising support brackets arranged at the upper part and lower part, respectively;

a cooling tank arranged on the support bracket at the upper part of the frame; and a heat exchanger arranged on the support bracket at the lower part of the frame, for exchanging heat between a coolant in the cooling tank and another cooling medium flowing through the heat exchanger, wherein the heat exchanger is a tubular heat exchanger and is arranged under the cooling tank, a coolant outlet of the heat exchanger is connected to a lower part of the cooling tank through a liquid outlet pipe of the heat exchanger, and a coolant inlet of the heat exchanger is connected to an upper part of the cooling tank through a liquid inlet pipe of the heat exchanger, wherein the cooling tank comprises:

a tank body for accommodating the coolant and computing equipment immersed in the coolant;

a cooling tank liquid inlet pipe extending along a length direction of the cooling tank, the cooling tank liquid inlet pipe being connected to the liquid outlet pipe of the heat exchanger, wherein the cooling tank liquid inlet pipe has a rectangular cross-section, and first multiple holes are arranged on opposite side walls of the cooling tank liquid inlet pipe along the length direction of the tank body; and a cooling tank liquid outlet pipe extending along the length direction of the tank body, and arranged at a higher position than the cooling tank liquid inlet pipe.

2. The cooling device of claim 1, wherein a flow reducing plate is arranged in the liquid inlet pipe of the cooling tank, and second multiple holes are formed on the flow reducing plate.

3. The cooling device of claim 1, wherein a flow guide having a trench shape is provided on circumference of the cooling tank liquid outlet pipe for accommodating the cooling tank liquid outlet pipe, the flow guide is installed on the tank body of the cooling tank.

4. The cooling device of claim 1, wherein, third multiple holes are formed on the cooling tank liquid outlet pipe, and the third multiple holes are formed in a lower wall of the cooling tank liquid outlet pipe.

5. The cooling device of claim 1, wherein a support block is provided at a bottom of the cooling tank, and a height of the support block is flush with a height of the cooling tank liquid inlet pipe.

6. The cooling device of claim 1, wherein the liquid inlet pipe of the heat exchanger is connected to an oil pump arranged on the support bracket at the lower part of the frame, for pumping the coolant out of the cooling tank into the heat exchanger.

7. The cooling device of claim 1, wherein a first end of the heat exchanger is provided with a water inlet and a water outlet, and cooling water flows into or out of the heat exchanger through a water pump arranged on the support bracket at the lower part of the frame.

8. The cooling device of claim 7, wherein the coolant outlet of the heat exchanger is arranged at the first end of the heat exchanger, and the coolant inlet of the heat exchanger is arranged at a second end of the heat exchanger, the second end being opposite to the first end.

9. The cooling device of claim 1, wherein the cooling device further comprises one or more of the following sensors:

an outlet temperature sensor for monitoring a coolant temperature at the coolant outlet of the heat exchanger, an inlet temperature sensor for monitoring a coolant temperature at the coolant inlet of the heat exchanger, a coolant flow sensor for monitoring a coolant flow, a coolant pressure sensor for monitoring a coolant pressure, an ambient temperature sensor for monitoring temperature around the cooling tank, and a cooling tank level sensor for detecting a level of coolant in the cooling tank.

10. The cooling device of claim 9, wherein the cooling device further comprises a control cabinet, which is arranged on the support bracket at the lower part of the frame for controlling operation of the cooling device based on sensing data monitored by one or more of the sensors.

* * * * *